United States Patent
Goumballa et al.

(10) Patent No.: US 9,843,255 B1
(45) Date of Patent: Dec. 12, 2017

(54) CHARGE PUMP APPARATUS, PHASE-LOCKED LOOP, AND METHOD OF OPERATING A CHARGE PUMP APPARATUS

(71) Applicants: Birama Goumballa, Larra (FR); Cristian Pavao-Moreira, Frouzins (FR); Didier Salle, Toulouse (FR)

(72) Inventors: Birama Goumballa, Larra (FR); Cristian Pavao-Moreira, Frouzins (FR); Didier Salle, Toulouse (FR)

(73) Assignee: NXP USA, Inc., Austin, TX (US)

( * ) Notice: Subject to any disclaimer, the term of this patent is extended or adjusted under 35 U.S.C. 154(b) by 259 days.

(21) Appl. No.: 14/707,179

(22) Filed: May 8, 2015

(30) Foreign Application Priority Data

Dec. 8, 2014 (WO) .................. PCT/IB2014/002947

(51) Int. Cl.
*H03F 3/45* (2006.01)
*H02M 3/07* (2006.01)
(Continued)

(52) U.S. Cl.
CPC ................ *H02M 3/07* (2013.01); *G01S 7/02* (2013.01); *G01S 7/282* (2013.01); *H03L 7/0992* (2013.01)

(58) Field of Classification Search
CPC ............... H03F 1/0222; H03F 2200/78; H03F 2203/45138; H03F 3/45475
(Continued)

(56) References Cited

U.S. PATENT DOCUMENTS

| 5,532,636 A | 7/1996 | Mar et al. |
| 6,288,660 B1 | 9/2001 | Nisbet |

(Continued)

FOREIGN PATENT DOCUMENTS

| EP | 1 870 716 A1 | 12/2007 |
| GB | 2 333 915 A | 8/1999 |

(Continued)

OTHER PUBLICATIONS

Chen, Wenhua et al; "A Concurrent Dual-Band Uneven Doherty Power Amplifier with Frequency-Dependent Input Power Division"; IEEE Transactions on Circuits and Systems I: Regular Papers, IEEE, US, vol. 61, No. 2; pp. 552-561 (Jan. 24, 2014).

(Continued)

*Primary Examiner* — Timothy A Brainard
(74) *Attorney, Agent, or Firm* — Charlene R. Jacobsen

(57) ABSTRACT

A charge pump comprises a charge pump circuit with bipolar switching devices with a common emitter. A collector line which comprises a first current source connects to the high potential provider. An emitter line connects the common emitter to a low potential provider and comprises a second current source. The output is provided by or connected to the collector of the second bipolar switching device and provides said output voltage.

A driving stage circuit applies a charge pump circuit driving signal across the bases of the bipolar switching devices and controls the charge pump circuit driving signal in accordance with a driving stage input signal. The driving stage circuit effects a shift of a DC operating point of the charge pump circuit driving signal as an increasing function of the output voltage function of the output voltage of the charge pump circuit.

15 Claims, 7 Drawing Sheets

(51) Int. Cl.
*H03L 7/099* (2006.01)
*G01S 7/282* (2006.01)
*G01S 7/02* (2006.01)

(58) Field of Classification Search
USPC ........................................................ 330/261
See application file for complete search history.

(56) References Cited

U.S. PATENT DOCUMENTS

| | | |
|---|---|---|
| 7,078,976 B2 | 7/2006 | Blednov |
| 7,358,807 B2 | 4/2008 | Scuderi et al. |
| 7,602,255 B1 | 10/2009 | Lai et al. |
| 7,884,688 B2 | 2/2011 | Takemoto et al. |
| 7,898,338 B2 | 3/2011 | Blednov |
| 8,022,739 B2 | 9/2011 | Yan |
| 8,160,121 B2 | 4/2012 | Forenza et al. |
| 8,396,368 B2 | 3/2013 | Tarlazzi et al. |
| 8,487,703 B2 | 7/2013 | Blednov |
| 8,717,099 B2 | 5/2014 | Wilson et al. |
| 9,077,285 B2 | 7/2015 | Holmes |
| 9,325,324 B1 | 4/2016 | Gupta et al. |
| 9,628,093 B2 | 4/2017 | Goumballa et al. |
| 2006/0071716 A1 | 4/2006 | Fang et al. |
| 2008/0018396 A1 | 1/2008 | Mallet-Guy et al. |
| 2010/0176885 A1 | 7/2010 | Kim et al. |
| 2010/0237944 A1* | 9/2010 | Pierdomenico ....... H03F 1/0222 330/261 |
| 2013/0241639 A1 | 9/2013 | Wilson et al. |
| 2014/0064394 A1 | 3/2014 | Wang et al. |
| 2015/0145601 A1 | 5/2015 | Moronval et al. |

FOREIGN PATENT DOCUMENTS

| | | |
|---|---|---|
| WO | WO-2014/068351 A2 | 5/2014 |
| WO | 2015008108 A1 | 1/2015 |
| WO | WO-2015/14560 A1 | 1/2015 |

OTHER PUBLICATIONS

Nghiem, Xuan Anh et al; "Design of a Broadband Three-Way Sequential Doherty Power Amplifier for Modern Wireless Communications"; IEEE (2014).
U.S. Appl. No. 15/299,041 not yet published (filed Oct. 20, 2016).
U.S. Appl. No. 15/616,125; not yet published; filed Jun. 7, 2016.
U.S. Appl. No. 15/698,916, not yet published; filed Sep. 8, 2017.

* cited by examiner

CHARGE PUMP APPARATUS, PHASE-LOCKED LOOP, AND METHOD OF OPERATING A CHARGE PUMP APPARATUS

CROSS REFERENCE TO RELATED APPLICATION(S)

The present application claims priority to International Patent Application No. PCT/IB2014/002947, entitled "CHARGE PUMP APPARATUS, PHASE-LOCKED LOOP, AND METHOD OF OPERATING A CHARGE PUMP APPARATUS," filed on Dec. 8, 2014, the entirety of which is herein incorporated by reference.

FIELD OF THE INVENTION

This invention relates to a charge pump apparatus, a phase-locked loop, and a method of operating a charge pump apparatus.

BACKGROUND OF THE INVENTION

FIG. 1 schematically illustrates an example of a phased-lock loop (PLL) 10. The PLL 10 may be operated to produce a PLL output signal which may be a high frequency (HF) signal with an oscillation frequency Fvco and a phase that may be locked with respect to a reference signal with frequency Fref that may be a fraction of the frequency Fvco of the PLL 10. In the example, the PLL 10 comprises a frequency detector 14 (e.g., a phase frequency detector PFD), a charge pump (CPA) 16, a loop filter 17 (e.g., a low-pass filter), a voltage controlled oscillator (VCO) 18, and a frequency divider 20. The phase detector 14 may have a first input connected to an output of a reference oscillator 12, and a second input connected to an output of the frequency divider 20. The CPA 16 may have an input connected to an output of the phase detector 14. The loop filter 17 may have an input connected to the output of the CPA 16. The VCO 18 may have an input connected to an output of the loop filter 17. The frequency divider 20 may have an input connected to an output of the VCO 18.

In operation, the reference oscillator 12 may generate a reference signal which is periodic with a frequency Fref called the reference frequency. The reference signal may, for example, be a bi-level signal. Alternatively, the reference signal may be a continuous periodic signal, e.g., a square wave form. The phase detector 14 may compare the reference signal from the reference oscillator 12 against a feedback signal from the frequency divider 20. Ideally, the feedback signal is periodic and has a constant phase shift, e.g., zero, relative to the reference signal. The phase detector 14 may generate a phase detection signal that is indicative of a measure of the phase shift of the feedback signal relative to the reference signal. The CPA 16 may translate the phase detection signal into a CPA output voltage. The loop filter 17 may filter the CPA output voltage to generate a tuning voltage Vtune that may determine the oscillation frequency Fvco of the VCO 18. The VCO output signal, i.e., the oscillatory signal with frequency Fvco produced by the VCO 18, may be fed, for example, to an antenna (not shown), e.g., through a power amplifier (PA). The antenna may thus be driven to emit electromagnetic waves in accordance with the VCO output signal.

The VCO output signal may also be fed to the frequency divider 20. The frequency divider 20 may generate a frequency divider output signal which is a periodic signal, e.g., a bi-level periodic signal, which has a frequency that is a fraction Fvco/N of the oscillation frequency Fvco of the VCO 18. Thus, a negative feedback loop from the VCO 18 to the phase detector 14 may be formed. The phase detector 14 and the CPA 16 may be configured such that the tuning voltage Vtune rises when the phase shift detected by the phase detector 14 decreases and such that the tuning voltage Vtune falls when the detected phase shift increases, making the tuning voltage Vtune converge at a steady state level. The PLL 10 is said to be locked when the tuning voltage Vtune has converged.

The VCO frequency Fvco can be varied by varying the reference frequency Fref or the divider ratio N. The PLL may for example used for radio frequency or mm-wave frequency ranges The PLL 10 may, for example, be part of a radar transmitter in which the reference frequency Fref or the divider ratio N, and thus the VCO frequency Fvco, is driven to generate frequency ramps of the transmitted radar signal.

In the automotive industry for example, it is known to provide vehicles with radar systems. For example a short range radar system may be provided to aid a driver of the vehicle in determining a distance between the vehicle and nearby objects, such as other vehicles during, say, a parking manoeuvre or the like. Additionally, a longer range radar system may be provided for use with an adaptive cruise control system, whereby the cruise control system maintains a substantially constant distance between the vehicle in which the system is provided and a vehicle in front. Typically, such an automotive radar system comprises a transmitter for transmitting a carrier signal within a given frequency band, for example within a microwave frequency band of between 24 and 77 GHz, and upon which a modulation is applied. The automotive radar system further comprises a receiver for receiving a reflection of the transmitted signal reflected back by a nearby object. A delay and frequency shift between the transmitted and received signals may then be measured, and a distance between the vehicle and the nearby object by which the signal was reflected, and also a speed difference between the two, may be calculated.

FIG. 2 schematically illustrates an example of an embodiment of the charge pump16. The CPA 16 may comprise a driving stage circuit 200 and a charge pump circuit CPC 202. The driving state circuit 200 may have an input, e.g., a differential input, connected to the phase detector 14 (see FIG. 1) and be arranged to translate the phase detection signal from the phase detector 14 into a charge pump circuit driving signal for driving the charge pump circuit 202. For example, the driving state circuit 200 may be arranged to apply an amplitude scaling factor and a level shift to the received phase detection signal. In the example, the driving state circuit 200 comprises a follower or buffer circuit 196 connected in series with an adapter circuit 198. The follower circuit 196 may have an input connected to the phase detector 14. The adapter circuit 198 may have an output connected to the charge pump circuit 202. The driving state circuit 200 may further comprise a bias circuit 252 connected to one or more the follower circuit 196 and the adapter circuit 198. The bias circuit 252 may be arranged to bias one or more nodes of the driving state circuit 200 to appropriate voltage levels.

In the example, the charge pump circuit 202 comprises a low voltage provider 226 (ground potential), a high voltage provider 216, and an output 211. A supply voltage or a bias voltage may be applied between the low voltage provider 226 and the high voltage provider 216 for powering the charge pump circuit 202. To this end, the high and low voltage providers 216, 226 may be connected, for example, to a supply voltage provider (not shown) such as an AC to DC converter or a battery. The high and low voltage providers 216, 226 may be shared with the driving stage circuit 200, although this is not shown in FIG. 2.

The charge pump circuit 202 may comprise a first current source 203 and a second current source 290. They may be referred to as the charging source 203 and the discharging source 290, respectively. The charge pump circuit 202 may further comprise a first bipolar switching device 286, e.g., a first bipolar junction transistor (BJT), and a second bipolar switching device 288, e.g., a second BJT. The first and second bipolar switching devices 286, 288 may be arranged in a differential pair configuration, e.g., an emitter-coupled configuration. More specifically, the first bipolar switching device 286 may have an emitter connected to an emitter of the second bipolar switching device 288. The first and second bipolar switching devices 286, 288 may thus have a common emitter. This common emitter may be connected to the low potential provider 226 via the second current source 290. The first bipolar switching device 286 may have a collector connected to the high potential provider 216 via a first collector line. Similarly, the second bipolar switching device 288 may have a collector connected to the high potential provider 216 via a second collector line. The first collector line may comprise a resistor 292. The first collector line may comprise a low-pass filter for dampening high frequency components of the voltage. In the example, the low-pass filter is implemented by a resistor 292 and a capacitor 294, connected between a node of the first collector line and the low potential provider 226. The second collector line may comprise the first current source 203. The CPC output 211 may be provided by or connected to the collector of the second bipolar switching device 288. A base of the first bipolar switching device 286 and a base of the second bipolar switching device 288 may together provide a differential input of the CPC 202. The differential input of the CPC 202 may be connected to a differential output of the driving stage circuit 200, e.g., to a differential output of the adapter circuit 198.

The CPA 16 may operate, for example, as follows. The phase detector 14 (see FIG. 1) may provide the phase detection signal to the driving stage circuit 200. The driving stage circuit 200 may translate the phase detection signal into a differential charge pump circuit driving signal. The charge pump circuit driving signal may be applied at the differential input of the CPC 202, i.e., across the base of the first bipolar switching device 286 and the base of the second bipolar switching device 288. The second current source 290 may draw a stationary current from the common emitter of the first and second bipolar switching devices 286, 288. The first and second bipolar switching devices 286, 288 may form a switching pair which may be operated so that one of them is on while the other one is off. For instance, when the first bipolar switching device 286 is on, i.e., conductive, and the second bipolar switching device 288 is off, i.e., nonconductive, the second current source 290 may draw its current entirely from the first bipolar switching device 286. At the same time, the first current source 203 may pump charge through the CPC output 211, thus raising the voltage at the output 211, i.e., the CPC output voltage Vtune, i.e., the tuning voltage for the VCO 18. In contrast, when the first bipolar switching device 286 is off and the second bipolar switching device 288 is on, the second current source 290 may draw its current from the CPC output 211 via the second bipolar switching device 288. The current drawn by the second current source 290 may have an amplitude larger than that of the current drawn by the first current source 203 to produce a net loss of charge at the output 211. Accordingly, the voltage at the output 211 may drop.

The negative feedback mentioned above in reference to FIG. 1 may ensure that a rise of the CPC output voltage increases the time during which the second bipolar switching device 288 is on and the first bipolar switching device 286 is off. The CPC output voltage may therefore converge or settle at a stationary level. The PLL 10 is then said to be locked.

Turning to FIG. 3, the charge pump16 may comprise a driving stage circuit 200 and a charge pump circuit 202. The driving stage circuit 200 may comprise a first differential down signal input 204 and a second differential down signal input 206. The first down signal input 204 may be coupled to a first differential down signal output (not shown) of the phase and frequency detector 114 and the second down signal input 206 may be coupled to a second differential down signal output (not shown) of the phase and frequency detector 114. The first down signal input 204 may be coupled to a first resistance 208 and the second down signal input 206 may be coupled to a second resistance 210. The first resistance 208 may be coupled to a base terminal of a first NPN bipolar transistor 212 and the second resistance 210 may be coupled to a base terminal of a second NPN bipolar transistor 214. A collector terminal of the first transistor 212 may be coupled to a voltage supply rail 216 via a third resistance 218 and a collector terminal of the second transistor 214 may be coupled to the voltage supply rail 216 via a fourth resistance 220. An emitter terminal of the first transistor 212 may be coupled to a collector terminal of a third NPN bipolar transistor 222 via a fifth resistance 224. An emitter terminal of the third transistor 222 may be coupled to a ground potential 226 via a sixth resistance 228. Similarly, an emitter terminal of the second transistor 214 may be coupled to a collector terminal of a fourth NPN bipolar transistor 230 via a seventh resistance 232 An emitter terminal of the fourth transistor 230 may be coupled to the ground potential 226 via an eighth resistance 234. Base terminals of the third and fourth transistors 222, 230 may be coupled together and to the ground potential 226 via a first capacitance 236. The above-described circuit configuration including: the first to eighth resistances 208, 210, 218, 220, 224, 228, 232, 234, the capacitance 236 and the first, second, third and fourth transistors 212, 214, 222, 230 constitute a buffer stage circuit.

A ground reference stage circuit of the driving stage circuit 200 may comprise a fifth NPN bipolar transistor 238 and a sixth NPN bipolar transistor 240 arranged in a differential pair configuration. A base terminal of the fifth transistor 238 may be coupled to the collector terminal of the fourth transistor 230 and a base terminal of the sixth transistor 240 may be coupled to the collector terminal of the third transistor 222. A collector terminal of the fifth transistor 238 may be coupled to a drain terminal of a first P-channel Metal Oxide Semiconductor Field Effect Transistor (MOSFET) 242; a source terminal of the first MOSFET 242 may be coupled to the supply rail 216. Similarly, a collector terminal of the sixth transistor 240 may be coupled to a drain terminal of a second P-channel MOSFET 244; a source terminal of the second MOSFET 244 may be coupled to the supply rail 216. A gate terminal of the first MOSFET 242 may be coupled to a gate terminal of the second MOSFET 244. The gate terminals of the first and second MOSFETs 242, 244 may also be coupled to the supply rail 216 via second capacitance 246. The gate terminals of the first and second MOSFETS 242, 244 may be coupled to a gate terminal of a third N-channel MOSFET 248 via a ninth resistance 250. The second and third MOSFETs may serve as a first current mirror. A source terminal of the third MOSFET 248 may be coupled to the supply rail 216 and a drain terminal of the third MOSFET 248 may be coupled to a bias circuit 252. Emitter terminals of the fifth and sixth transistors 238, 240 may be coupled to a collector terminal of a seventh NPN bipolar transistor 254. An emitter terminal of the seventh transistor 254 may be coupled to the ground potential 226 via a tenth resistance 256.

The collector terminal of the sixth transistor 240 may be coupled to first terminals of an eleventh resistance 260; a second terminal of the eleventh resistance 260 may be coupled to a collector terminal of an eighth NPN bipolar transistor 264 and to the ground potential via a third capacitance 266. A base terminal of the seventh transistor 264 may be coupled to the collector terminal thereof. An emitter terminal of the seventh transistor 264 may be coupled to the ground potential via a thirteenth resistance 268.

An amplifier circuit stage may comprise the first terminal of the eleventh resistance 260 being coupled to a base terminal of a ninth NPN bipolar transistor 270 via a fourteenth resistance 272. A first terminal of a twelfth resistance 262 may be coupled to the collector terminal of the fifth transistor 238 and a base terminal of a tenth NPN bipolar transistor 274 via a fifteenth resistance 276. A second terminal of the twelfth resistance 262 may be coupled to the collector terminal of the eighth transistor 264. Collector terminals of the ninth and tenth transistors 270, 274 may be coupled to the supply rail 216. An emitter terminal of the ninth transistor 270 may be coupled to a collector terminal of an eleventh NPN bipolar transistor 278. An emitter terminal of the eleventh transistor 278 may be coupled to the ground potential 226 via a sixteenth resistance 280. An emitter terminal of the tenth transistor 274 may be coupled to a collector terminal of a twelfth NPN bipolar transistor 282. An emitter terminal of the twelfth transistor 282 may be coupled to the ground potential 226 via a seventeenth resistance 284. Base terminals of the eleventh and twelfth transistors 278, 282 may be coupled to the base terminals of the third, fourth and seventh transistors 222, 230, 254 and the bias circuit 252.

The emitter terminals of the ninth and tenth transistors 270, 274 may be coupled to the charge pump circuit 202. In this respect, the charge pump circuit 202 may comprise a thirteenth NPN bipolar transistor 286 and a fourteenth NPN bipolar transistor 288 arranged in a differential pair configuration. A base terminal of the thirteenth transistor 286 may be coupled to the emitter terminal of the ninth transistor 270 and a base terminal of the fourteenth transistor 288 may be coupled to the emitter terminal of the tenth transistor 274; the base terminals of the thirteenth transistor 286 and the fourteenth transistor 288 may constitute differential control terminals. Emitter terminals of the thirteenth and fourteenth transistors 286, 288 may be coupled to the ground potential 226 via a pulsed current source 290; the pulsed current source may be coupled to the bias circuit 252.

A collector terminal of the thirteenth transistor 286 may be coupled to a trickle current supply rail 291 via an eighteenth resistance 292. The collector terminal of the thirteenth transistor 286 may also be coupled to the ground potential 226 via a fourth capacitance 294 and a fifth capacitance 296 coupled in series. A collector terminal of the fourteenth transistor 288 may be coupled to a drain terminal of a fourth P-channel MOSFET 201. An output 211 for coupling to the low-pass filter 104 may also be taken from the collector terminal of the fourteenth transistor 288. A source terminal of the fourth MOSFET 201 may be coupled to the trickle current supply rail 291 via a trickle current source 203; the trickle current source 203 may be coupled to the bias circuit 252. A gate terminal of the fourth MOSFET 201 may be coupled to a potential divider. In this respect, the gate terminal of the fourth MOSFET 201 may be coupled to the ground potential 226 via a nineteenth resistance 205 and to the trickle current supply rail 291 via a twentieth resistance 207.

It is pointed out that the design of the charge pump circuit 202 described in greater detail below may be independent of the details of the driving state circuit 200. Therefore, the driving stage circuit 200 may be implemented differently as compared to FIG. 3. Accordingly, the specific implementation the driving stage circuit 200 described above with reference to FIG. 3 is only an example.

SUMMARY OF THE INVENTION

The present invention provides a charge pump apparatus, a phase-locked loop, and a method of operating a charge pump as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. Like reference numerals are used to designate like or similar components.

DETAILED DESCRIPTION OF THE PREFERRED EMBODIMENTS

Figure 1:
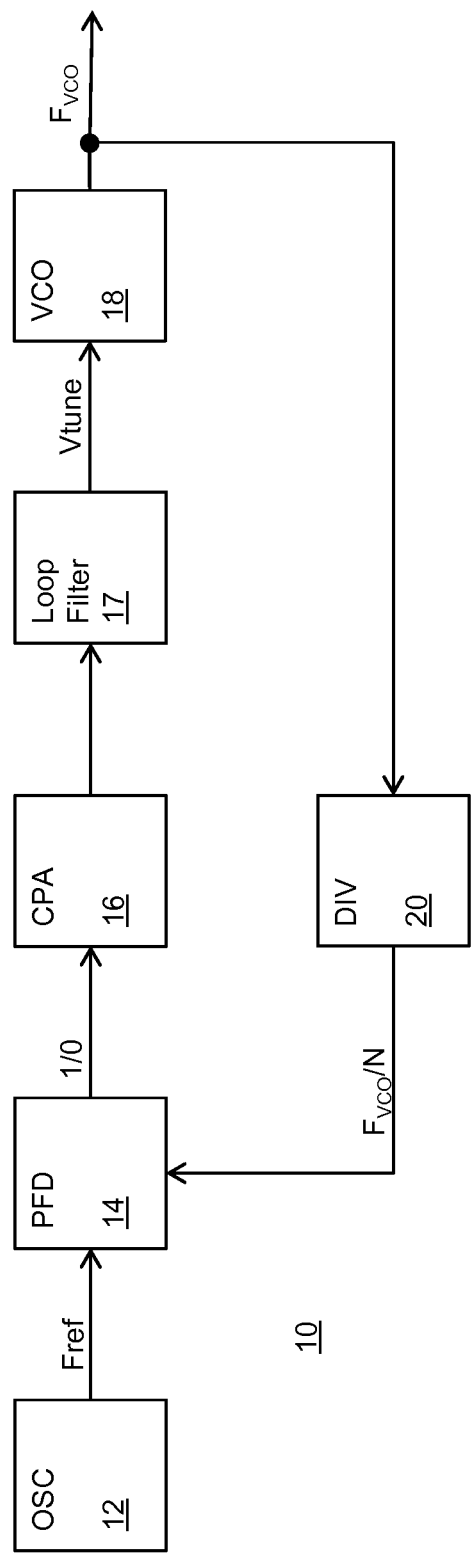
FIG. 1 schematically shows an example of an embodiment of a phase-locked loop PLL.

FIGS. 4 to 7 schematically illustrate an example of an improved embodiment of a charge pump16. The charge pump may comprise a charge pump circuit 202 for providing an output voltage and a driving stage circuit 200 which is connected to the charge pump circuit 202 and arranged to drive the charge pump circuit 202.

The charge pump circuit 202 may comprise a first bipolar switching device 286, a second bipolar switching device 288, a first collector line, a second collector line, an emitter line, and an output 211. Each of the first and second bipolar switching devices 286, 288 may comprise a collector, an emitter, and a base. The emitter of the first bipolar switching device 286 and the emitter of the second bipolar switching device 288 may be connected to each other so as to form together a common emitter of the first and second bipolar switching device 286, 288. The first collector line may connect the collector of the first bipolar switching device 286 to a high potential provider 216. The second collector line may connect the collector of the second bipolar switching device 288 to the high potential provider 216 and comprise a first current source 203. The emitter line may connect the common emitter of the first and second bipolar switching devices to a low potential provider 226 and comprise a second current source 290. The output 211 may be provided by or connected to the collector of the second bipolar switching device 288 and it may provide said output voltage.

The driving stage circuit 200 may be arranged to apply a charge pump circuit driving signal across the base of the first bipolar switching device 286 and the base of the second bipolar switching device 288 and to control the charge pump circuit driving signal in accordance with a driving stage input signal. The charge pump circuit driving signal may have a direct current (DC) operating point relative to the low potential provider 226. The driving stage circuit 200 may be arranged to effect a shift of the DC operating point of the charge pump circuit driving signal as a function of the output voltage of the charge pump circuit 202. For example, the driving stage circuit 200 may comprise a controllable resistor 268 having a resistance which is controllable, and the shift of the DC operating point may be a function of this resistance. The shift may be an increasing function of the output voltage of the charge pump circuit 202, e.g., an increasing step function. An avalanche breakdown effect in the charge pump circuit 202 may thus be limited or avoided, as will be described in greater detail further below. This in turn allows to reduce avalanche noise multiplication, and make the solution particularly suited for application in a PLL used in automotive radar systems but of course other applications may likewise be suitable.

In one example, the driving stage circuit 200 comprises an output sensing unit 400 connected to the output 211 of the charge pump circuit. The output sensing unit 400 may have associated with it a countable set of two or more adjoining ranges and be arranged to detect an operating range in the countable set of two or more adjoining ranges, wherein the operating range is the range that comprises the output voltage of the charge pump circuit 202. For instance, the driving stage circuit 200 may comprise a controllable resistor 268 that has a control input connected to an output of the output sensing unit 400, the controllable resistor 268 having a resistance which is a function of the operating range detected by the output sensing unit 400. The output sensing unit 400 may, for example, comprise two or more comparators 402 arranged to determine the operating range. The output sensing unit 400 is arranged to memorize the operating range. For instance, the output sensing unit 400 may comprise a memory element, e.g., comprising one or more flip-flips, for memorizing the operating range. The operating range can thus be determined at selected times, e.g., in response to detecting a change in the output voltage, and be held constant as desired, e.g., to give the PLL sufficient time to lock.

The driving stage circuit 200 may be connected or connectable between the high potential provider 216 and the low potential provider 226 so as to be powered by the high potential provider 216 and the low potential provider 226. The same supply voltage levels can thus be applied at driving stage circuit 200 and the charge pump circuit 202, which is favourable for a design in which the DC operating point of the charge pump circuit driving signal is controlled by controlling one or more internal elements of the driving stage circuit 200.

Figure 2:
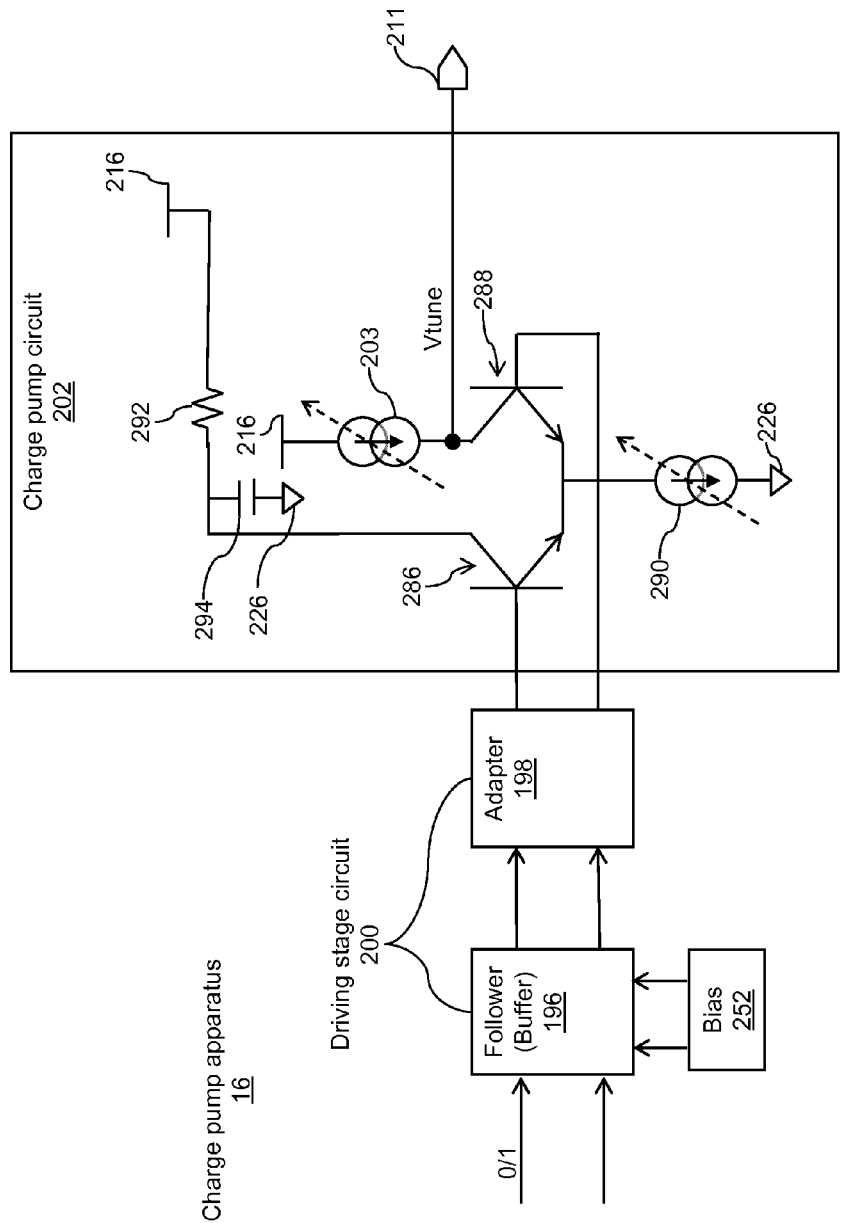
FIG. 2 schematically shows an example of an embodiment of a charge pump apparatus.
Figure 3:
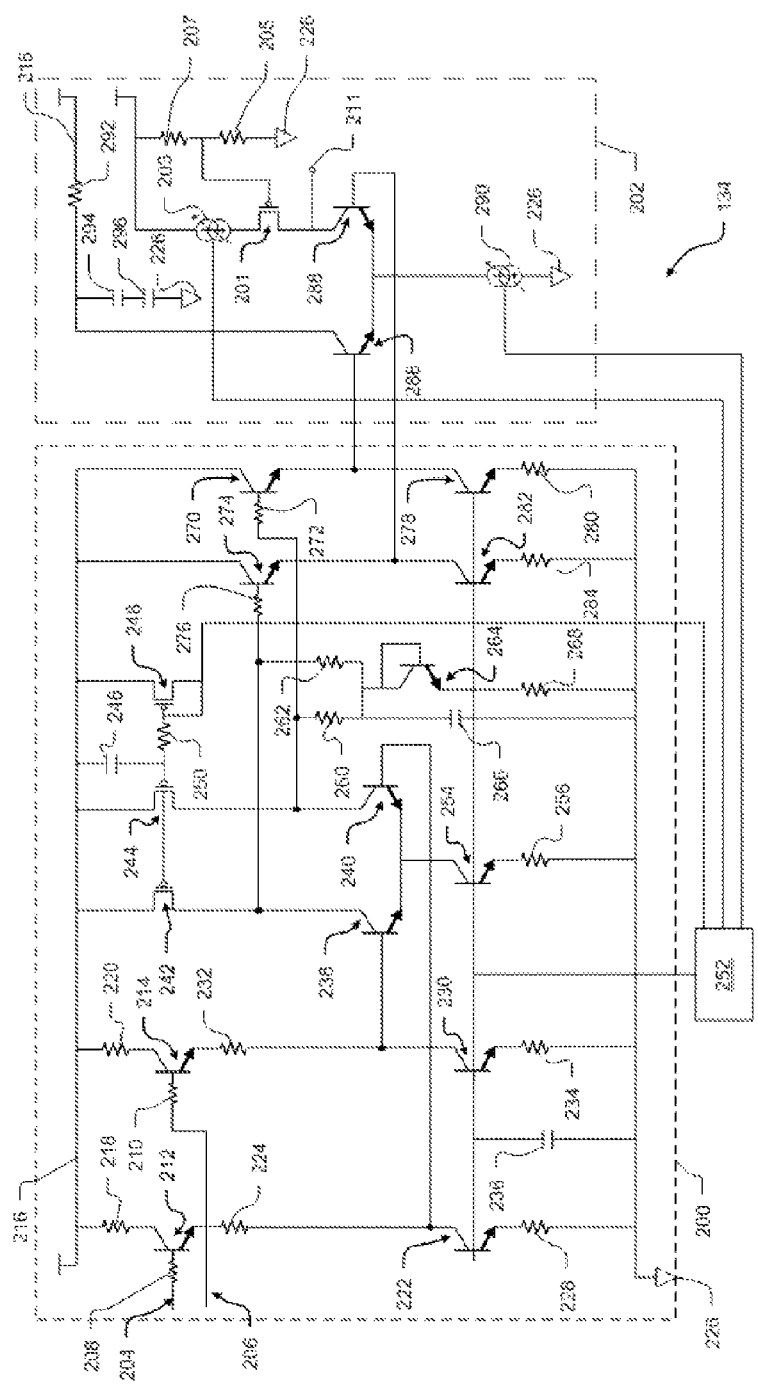
FIG. 3 schematically shows an example of an embodiment of a charge pump apparatus.
Figure 4:
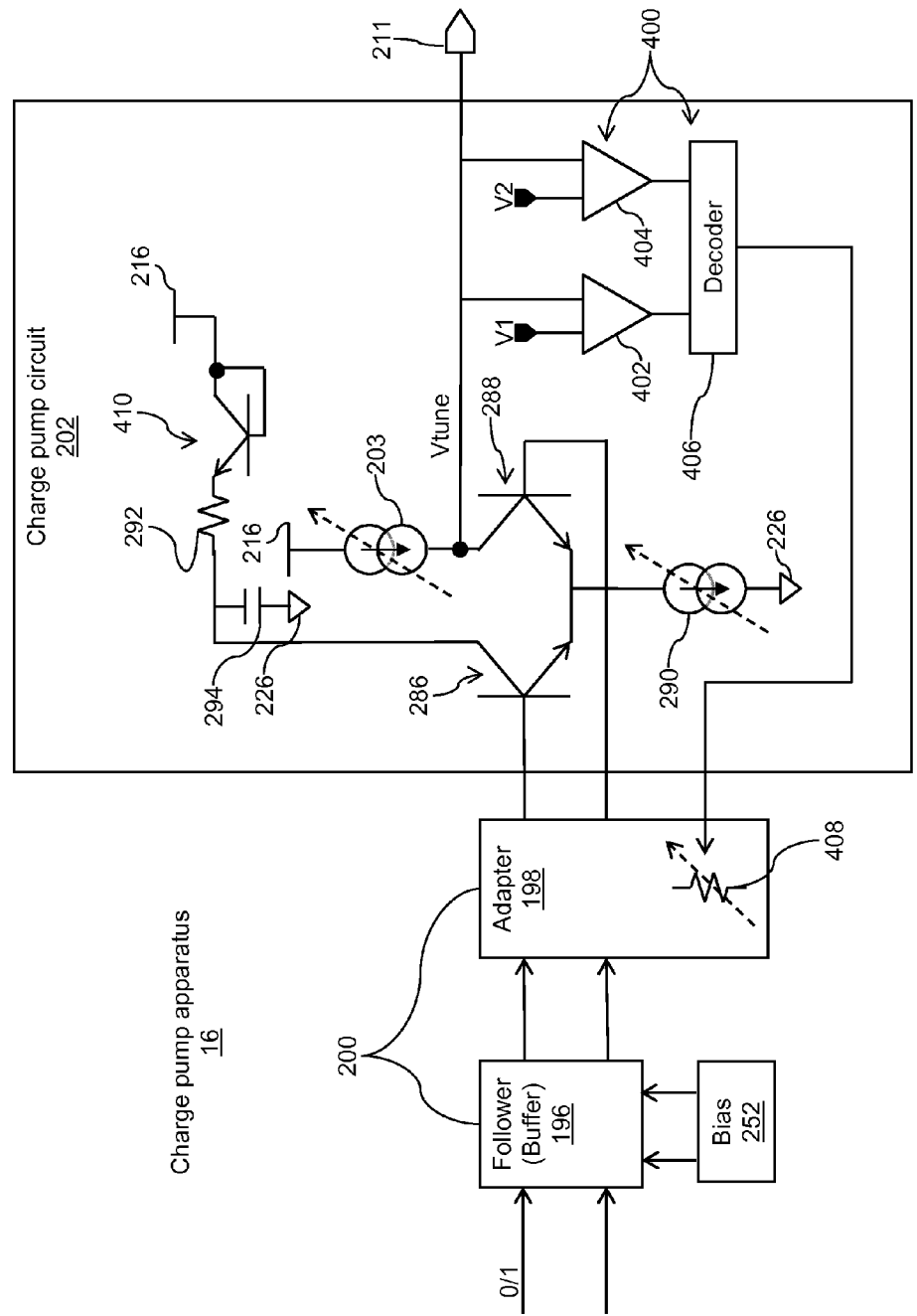
FIG. 4 schematically shows an example of an embodiment of a charge pump apparatus.

More specifically, FIG. 4 illustrates an example of a charge pump16 which may differ from the one described with reference to FIGS. 1 to 3 in that it comprises additional circuitry for adjusting the voltage at the common emitter of the first and second bipolar switching devices 286, 288. More specifically, the charge pump may comprise an output sensing unit 400 having an output connected to the driving stage unit 200, e.g., to the adapter circuit 198, and arranged to control the driving stage unit 200 so as to adapt the DC operating point of the differential CPC driving signal as a function of the CPC output voltage Vtune. The driving stage circuit 200 may thus be arranged to raise the DC operating point of the CPC driving signal in response to detecting, e.g., that the CPC output voltage Vtune is above a certain level.

In the CPC 202, a rise of the levels at the bases of the first and second bipolar switching devices 286, 288 may cause a corresponding rise of the emitter voltage, that is, the voltage at the common emitter of the first and second bipolar switching devices 286, 288. The collector voltages on the other hand, i.e., the voltage at the collector of the first bipolar device 286 and the voltage at the collector of the second bipolar switching device 288, may be substantially independent of the base and emitter voltages. Notably, the voltage at the collector of the first bipolar switching device 286 may be substantially fixed by the voltage of the high potential provider 216 and the current through the first collector line, i.e., the line comprising the resistor 292. The current through the first collector line may, in turn, be substantially fixed by the second current source 290, for any stationary state of the second bipolar switching device 288.

In a simplified manner, it may be stated that the driving stage circuit 200 may be arranged for the common emitter voltage of the first and second bipolar switching devices 286, 288 to follow the CPC output voltage Vtune. The collector emitter voltage, i.e., the voltage between the collector and the emitter, of the first bipolar switching device 286 and the collector emitter voltage of the second bipolar switching device 288 can thus be limited, e.g., to remain below a certain threshold above which avalanche breakdown may occur. Avalanche breakdown is a spurious effect which may be observed in a bipolar transistor and which may occur when the collector emitter voltage exceeds a certain level. Avalanche breakdown may produce noise in the tuning voltage Vtune. Operating the bipolar switching devices 286, 288 in a voltage range in which there is no avalanche breakdown may therefore reduce noise in the tuning voltage Vtune.

The critical collector emitter voltage above which avalanche breakdown may occur depends on the physical details of the BJT in question. In one example of a BJT, avalanche breakdown may occur when the collector emitter voltage exceeds approximately 3 volts.

In the example, the sensing unit 400 is arranged to define three adjoining ranges for the tuning voltage Vtune, namely the range below a first trip point V1, the range between V1 and a second trip point V2, and the range above V2, wherein V2 is a level higher than V1. V2 may, for example, be at least 20%, at least 50%, or at least 100% higher than V1. For instance, V1 and V2 may be 3 volts and 4 volts, respectively. Defining the trip points V1 and V2 is a design consideration that may depend on parameters such as the particular type of the first and second bipolar switching devices 286, 288 and the range of the tuning voltage Vtune for which the charge pump circuit 202 is intended.

In the example, the output sensing unit 400 may comprise a first comparator 402, a second comparator 404, and a decoder 406. The first comparator 402 may have a first input at which a first bias voltage may be applied to specify the first trip point V1 and a second input connected to the CPC output 211. The second comparator 404 may have a first input at which a second bias voltage may be applied to specify the second trip point V2 and a second input connected to the CPC output 211. The decoder 406 may have a first input connected to an output of the first comparator 402 and a second input connected to an output of the second comparator 404. The driving stage circuit 200 may comprise a bias control unit having a bias control input connected to an output of the decoder 406. In the example, the bias control unit is provided by a tuneable resistor, the tuneable resistor having a control input connected to the output of the decoder 406.

In operation, the first comparator 402 and the second comparator 404 may compare the tuning voltage Vtune against the trip points V1 and V2, respectively. The collective output from the comparators 402, 404 may thus indicate a detected range of the tuning voltage, namely one of the three ranges Vtune<V1, V1<Vtune<V2, and V2<Vtune, wherein the detected range of Vtune is the particular range that contains Vtune. The decoder 406 may generate a bias control signal as a function of the detected range of Vtune. The bias control unit, e.g., the tuneable resistor 408, may act in accordance with the bias control signal from the decoder 406 to adapt the bias, i.e., the DC operating point of the bases of the first and second bipolar switching devices 286, 288 and thus the bias or DC operating point of the common emitter of the first and second bipolar switching devices 286, 288.

The first collector line may further comprise a diode 410 for defining the voltage level at the collector of the first bipolar switching device 286. The diode 410 may contribute to limiting or avoiding the avalanche effect in the first collector line, thus avoiding or reducing baseband noise degradation at the charge pump output. In other words, the diode 410 may define the voltage level on the collector of the first bipolar switching device 286 so as to avoid or reduce the avalanche effect. The diode 410 may, for example, be implemented as a bipolar transistor connected in a diode configuration. The bipolar transistor may, for example, have an emitter connected to the collector of the first bipolar switching device 286 (e.g., via the resistor 292) and a base-shorted collector connected to the high potential provider 216.

During a frequency ramp, e.g., in a radar application, the tuning voltage Vtune may increase, e.g., approximately linearly with respect to time. When the tuning voltage Vtune passes through the first trip point V1, the driving stage circuit 200 may raise the DC operating point of the first and second bipolar switching devices 286, 288, i.e., perform a bias shift of the first and second bipolar switching devices 286, 288. This may cause a spurious rise of the tuning voltage Vtune. It may take a certain time, e.g., one or more periods of the reference signal from the reference oscillator 12, for the tuning voltage Vtune to settle. The same applies similarly when the tuning voltage V2 passes through the second trip point V2, and also during a negative ramp, i.e., when the reference frequency and, accordingly, the tuning voltage Vtune decrease.

The driving stage circuit 200 may thus have one or more trip points V_k, k=1 to n, n being the total number of trip points. Each trip point is the border between two adjoining ranges of the tuning voltage Vtune. Furthermore, the driving stage circuit 200 may be arranged to adapt the DC operating point of the bipolar switching device 286, 288 to the range that currently contains the tuning voltage as detected by the sensing unit 400, for example. The DC operating point may thus be an increasing step function of the tuning voltage Vtune.

Figure 5:
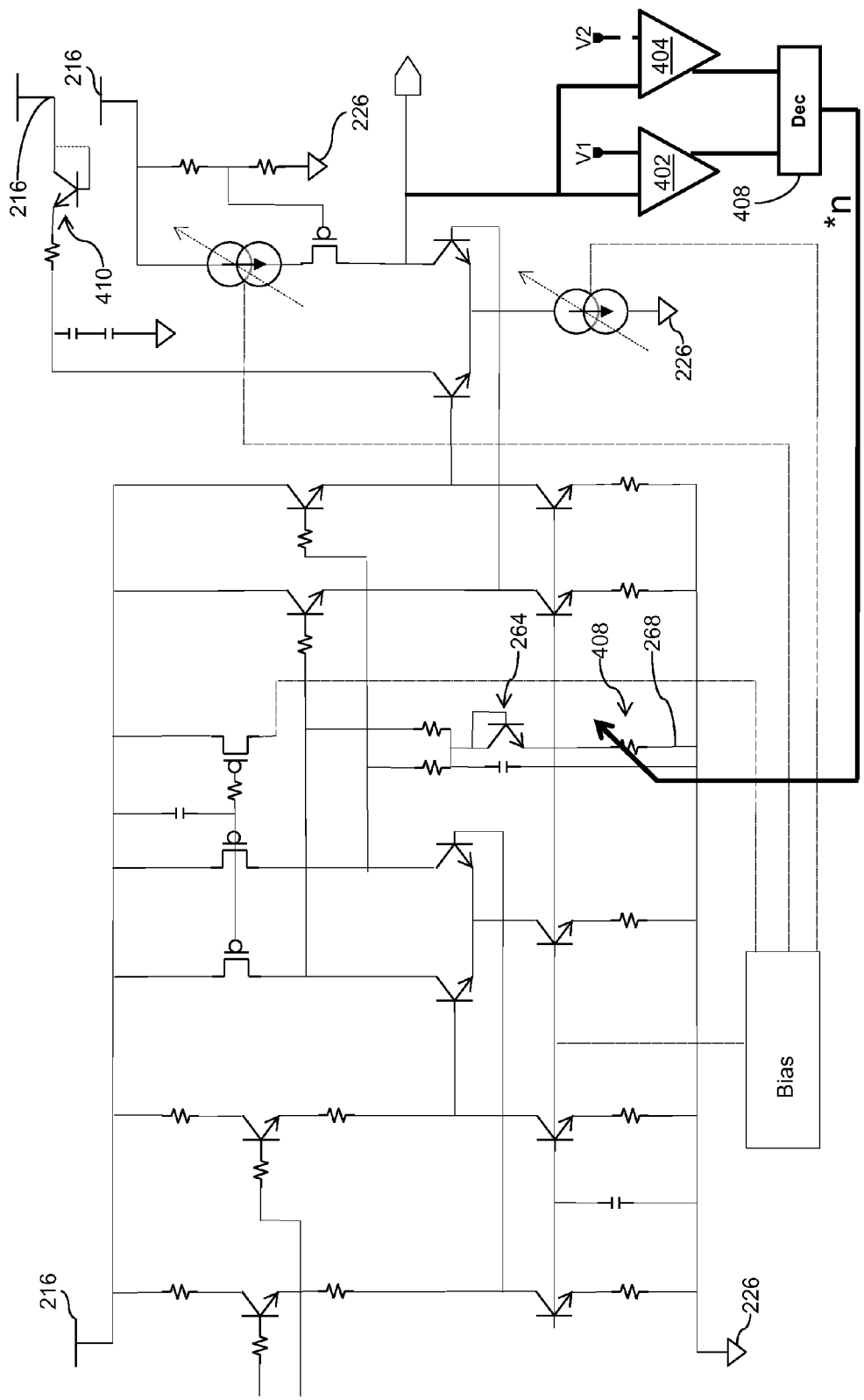
FIG. 5 schematically shows an example of an embodiment of a charge pump apparatus.

FIG. 5 shows an example of an embodiment of the charge pump16 from FIG. 4 in which the driving stage circuit 200 is implemented as described above in reference to FIG. 2. In the example of FIG. 5, the bias control unit 408 comprises a tuneable resistor, e.g., the resistor 268. It is pointed out that the bias control unit may be implemented differently.

Figure 6:
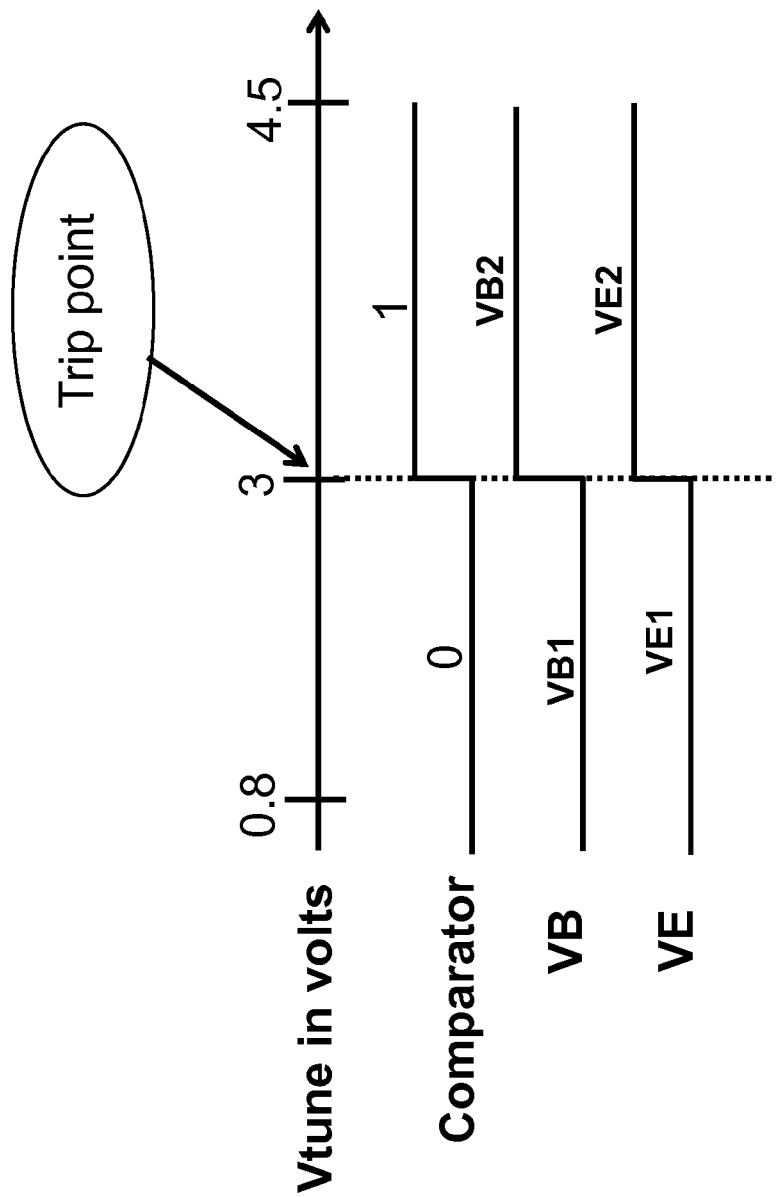
FIG. 6 shows a diagram of voltage levels as functions of the tuning voltage in an example of an embodiment of a charge pump apparatus.

As schematically illustrated in FIG. 6, the tuning voltage Vtune may, for example, vary in a range of 0.8 to 4.5 volts. This range may, for example, be the range in which Vtune is varied during a frequency ramp in a radar application. In another example, a frequency ramp of, e.g., a radar application is restricted to a sub-range of the shown range of 0.8 to 4.5 volts. For instance, in one application, a frequency ramp may sweep out the range of 1 to 1.5 volts. In another application, a frequency ramp may correspond to the range of 3.2 to 4.0 volts, for example. A trip point, e.g., the first trip point V1 may be set at, e.g., 3 volts. Accordingly, the output of the comparator 402 may be 0 for Vtune<3 volts and 1 for Vtune>3 volts, and the DC operating point of the first and second bipolar switching devices 286, 288 may be raised at the trip point so that it is higher for Vtune above 3 volts than for Vtune below 3 volts. A corresponding rise of the DC operating points of the voltages at the bases and the emitter of the second bipolar switching device 288 is schematically shown as well.

Figure 7:
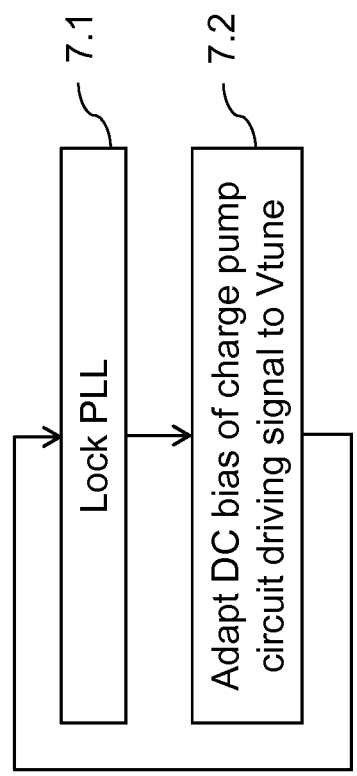
FIG. 7 shows a flowchart of an example of a method of operating a charge pump apparatus.

FIG. 7 shows a flow chart of an example of a method of operating a PLL that comprises a charge pump as described above, e.g., the CPA 16. The method may comprise operating the driving stage circuit 200 to apply a charge pump circuit driving signal across the base of the first bipolar switching device 286 and the base of the second bipolar switching device 288 and to control the charge pump circuit driving signal in accordance with a driving stage input signal, and operating the driving stage circuit 200 to effect a shift of the DC operating point of the charge pump circuit driving signal as a function of the output voltage of the charge pump circuit 202, wherein said shift is an increasing function of the output voltage of the charge pump circuit 202. For instance, the method may comprise, in this order, locking the PLL (7.1) and adapting the DC bias of the charge pump circuit driving signal to the tuning voltage Vtune (7.2). If the latter operation (7.2) results in the PLL becoming unlocked, the DC bias may be varied until the PLL has locked again (7.1). The DC bias of the charge pump circuit driving signal may be adapted to the tuning voltage Vtune (7.2) such that the DC bias is an increasing step function of the tuning voltage Vtune. The level of each step of the step function may be chosen such that the bipolar switching devices 286, 288 are operated in a voltage range in which avalanche breakdown is negligible or does not significantly deteriorate the behavior of the tuning voltage Vtune.

In the foregoing specification, the invention has been described with reference to specific examples of embodiments of the invention. It will, however, be evident that various modifications and changes may be made therein without departing from the broader spirit and scope of the invention as set forth in the appended claims.

Although specific conductivity types or polarity of potentials have been described in the examples, it will be appreciated that conductivity types and polarities of potentials may be reversed. Unless specified or implied otherwise, the voltage of a node is the electric potential of the node relative to a ground potential, e.g., the ground potential 226.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality. Notably, any type of resistive element or resistive network arranged to have a certain resistance may be referred to as a resistor. Similarly, any type of capacitive element or capacitive network arranged to have a certain capacitance may be referred to as a capacitor.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments. For example, the DC operating point of the charge pump circuit driving signal may be adapted continuously to the output voltage of the charge pump circuit, i.e., as a function of the tuning voltage Vtune, provided that the output voltage Vtune varies sufficiently slowly.

Also for example, in one embodiment, the illustrated examples may be implemented as circuitry located on a single integrated circuit (IC) or within a same device. For example, the PLL 10 may be located on a single IC. Alternatively, the examples may be implemented as any number of separate integrated circuits or separate devices interconnected with each other in a suitable manner. For example, the CPA 16 and the VCO 18 may be implemented as separate integrated circuits or separate devices.

The examples, or portions thereof, may also be implemented as soft or code representations of physical circuitry or of logical representations convertible into physical circuitry, such as in a hardware description language of any appropriate type.

Other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A charge pump, comprising:
   a charge pump circuit for providing an output voltage, and
   a driving stage circuit connected to the charge pump circuit and arranged to drive the charge pump circuit;
   the charge pump circuit comprising:
   a first bipolar switching device, a second bipolar switching device, a first collector line, a second collector line, an emitter line, and an output, each of the first and second bipolar switching devices comprising a collector, an emitter, and a base, wherein the emitter of the first bipolar switching device and the emitter of the second bipolar switching device are connected to each other so as to form together a common emitter of the first and second bipolar switching device, wherein the first collector line connects the collector of the first bipolar switching device to a high potential provider, the second collector line connects the collector of the second bipolar switching device to the high potential provider and comprises a first current source, the emitter line connects the common emitter of the first and second bipolar switching devices to a low potential provider and comprises a second current source, and the output is provided by or connected to the collector of the second bipolar switching device and provides said output voltage;
   the driving stage circuit is arranged to apply a charge pump circuit driving signal across the base of the first bipolar switching device and the base of the second bipolar switching device and arranged to control the charge pump circuit driving signal in accordance with a driving stage input signal, wherein the charge pump circuit driving signal has a DC operating point relative to the low potential provider; and
   the driving stage circuit is arranged to effect a shift of said DC operating point of the charge pump circuit driving signal as a function of the output voltage of the charge pump circuit, wherein said shift is an increasing function of the output voltage of the charge pump circuit.

2. The charge pump of claim 1, wherein the driving stage circuit comprises a controllable resistor having a resistance which is controllable, wherein said shift is a function of said resistance.

3. The charge pump of claim 1, wherein the driving stage circuit comprises an output sensing unit connected to the output of the charge pump circuit and having associated with it a countable set of two or more adjoining ranges and arranged to detect an operating range in the countable set of two or more adjoining ranges, the operating range being the range which comprises the output voltage of the charge pump circuit.

4. The charge pump of claim 3, wherein the driving stage circuit comprises a controllable resistor having a control input connected to an output of the output sensing unit, the controllable resistor having a resistance which is a function of the operating range detected by the output sensing unit.

5. The charge pump of claim 3, wherein the output sensing unit comprises two or more comparators arranged to determine the operating range.

6. The charge pump of claim 3, wherein the output sensing unit is arranged to memorize the operating range.

7. The charge pump of claim 1, wherein said increasing function is a step function.

8. The charge pump of claim 1, wherein the first collector line comprises a forward biased diode or a forward biased collector-base-shorted bipolar switching device.

9. The charge pump of claim 1, wherein the driving stage circuit is connected or connectable between the high potential provider and the low potential provider so as to be powered by the high potential provider and the low potential provider.

10. A phase-locked loop PLL, comprising the charge pump of claim 1.

11. A phase-locked loop PLL, comprising the charge pump of claim 1 and having a voltage-controlled oscillator VCO having an input connected to the output of the charge pump circuit.

12. A phase-locked loop PLL, comprising the charge pump of claim 1 and having a frequency detector and a frequency divider, wherein the frequency detector has a first input connected or connectable to a reference oscillator and a second input connected or connectable to an output of the frequency divider, and the frequency divider has an input connected to an output of the VCO.

13. A transmitter for an automotive radar system, comprising a PLL that comprises the charge pump of claim 1.

14. An automotive radar system comprising:
a transmitter as claimed in claim 13, for transmitting a radar signal
a receiver for receiving a reflection of the transmitted radar signal reflected back by a nearby object.

15. A method of operating a charge pump, the charge pump comprising a charge pump circuit for providing an output voltage and a driving stage circuit connected to the charge pump circuit and arranged to drive the charge pump circuit,
wherein the charge pump circuit comprises a first bipolar switching device, a second bipolar switching device, a first collector line, a second collector line, an emitter line, and an output, each of the first and second bipolar switching devices comprising a collector, an emitter, and a base, wherein the emitter of the first bipolar switching device and the emitter of the second bipolar switching device are connected to each other so as to form together a common emitter of the first and second bipolar switching device, wherein the first collector line connects the collector of the first bipolar switching device to a high potential provider, the second collector line connects the collector of the second bipolar switching device to the high potential provider and comprises a first current source, the emitter line connects the common emitter of the first and second bipolar switching devices to a low potential provider and comprises a second current source, and the output is provided by or connected to the collector of the second bipolar switching device and provides said output voltage; and
wherein the method comprises:
operating the driving stage circuit to apply a charge pump circuit driving signal across the base of the first bipolar switching device and the base of the second bipolar switching device and to control the charge pump circuit driving signal in accordance with a driving stage input signal,
operating the driving stage circuit to effect a shift of said DC operating point of the charge pump circuit driving signal as a function of the output voltage of the charge pump circuit, wherein said shift is an increasing function of the output voltage of the charge pump circuit.

* * * * *